United States Patent [19]

MacKenzie et al.

[11] Patent Number: 5,342,648
[45] Date of Patent: Aug. 30, 1994

[54] METHOD FOR FORMING AMORPHOUS FERROELECTRIC MATERIALS

[75] Inventors: John D. MacKenzie; Ren Xu, both of Los Angeles; Yuhuan Xu, Santa Monica, all of Calif.

[73] Assignee: The Regents of the Universty of California, Oakland, Calif.

[21] Appl. No.: 949,744

[22] Filed: Sep. 23, 1992

Related U.S. Application Data

[63] Continuation of Ser. No. 694,140, May 1, 1991, abandoned.

[51] Int. Cl.$^5$ .................... B05D 5/12; C04B 35/46
[52] U.S. Cl. ........................... 427/126.3; 427/100; 427/346; 427/376.2; 427/385.5; 501/134
[58] Field of Search ..................... 427/100, 126.3, 346, 427/385.5, 376.2; 501/134

[56] References Cited

PUBLICATIONS

Yi et al. "Preparation of Pb(Zr,Ti)O$_3$ Thin Films by Sol Gel Precrossing: Electrical, Optical and Electro-Optic Properties," J. Appl. Phys. 64(5) 2717–2724 Sep. 88.
Lines, "Microscopic Model for a Ferroelectric Glass", Physical Review B, vol. 15, No. 1, Jan. 1, 1977, pp. 388–395.
Glass, et al, "Anomalous Dielectric Behavior and Reversible Pyroelectricity in Roller-Quenches LiNbO$_3$ and LiTaO$_3$ Glass", Applied Physics Letters, vol. 31, No. 4, Aug. 15, 1977, pp. 249–251.
Mitsuyu, and Wasa, "High Dielectric Constant Films of Amorphous LiNbO$_3$ Prepared by Sputtering Deposition", Japanese Journal of Applied Physics, vol. 20, No. 1, Jan. 1981, pp. L48–L50.
Kitabatake, et al., "Structure and Dielectric Properties of Amorphous LiNbO$_3$ Thin Films Prepared by a Sputtering Deposition", J. Appl. Phys. 56 (6), Sep. 15, 1984, 1984 American Institute of Physics, pp. 1780–1784.
Fukushima, et al., "Preparation of Ferroelectric PZT Films by Thermal Decomposition of Organometallic Compounds", Journal of Materials Science 19 (1984) pp. 595–598.
Budd, et al., "The Effect of Hydrolysis Conditions on the Characteristics of PbTiO$_3$ Gels and Thin Films", Mat. Res. Soc. Symp. Proc. vol. 73, –1986 Materials Research Society, pp. 711–716.
Hirano, et al., "Formation of LinbO$_3$ Films by Hydrolysis of Metal Alkoxides", Journal of Non-Crystalline Solids 100 (1988) pp. 538–541, North Holland, Amsterdam.
Dey, et al., "Thin–Film Ferroelectrics of PZT by Sol–Gel Processing", IEEE Transactions on Ultrasonics, Ferroelectrics and Frequency Control, vol. 35, No. 1, Jan. 1988, pp. 80–81.
Budd, et al., "The Effect of Hydrolysis Conditions on the Characteristics of PbTiO$_3$ Gels and Thin Films", Mat. Res. Symp Proc. Vol. 72, 1986 Materials Research Society, pp. 317–322.
Wu, "Memory Retention and Switching Behavior of Metal-Ferroelectric-Semiconductor Transistors", Ferroelectrics 1976, vol. 11, pp. 479–484, (Gordon and Breach Science Publishers Ltd. 1976) Gr. Britain.
Chapman, et al., "Design and Performance of a Thin Film Ferroelectric-Photoconductor Storage Device", Ferroelectrics 1972, vol. 3, pp. 101–106, IEEE Trans. Sconics and Ultrasonics, 1972, SU 19, pp. 101.

Primary Examiner—Shrive Beck
Assistant Examiner—Benjamin L. Utech
Attorney, Agent, or Firm—Spensley Horn Jubas & Lubitz

[57] ABSTRACT

Amorphous ferroelectric materials are formed by a sol-gel type process and the ferroelectric properties stabilized by complete hydrolysis and polycondensation, and extraction of residual organic materials, preferably by heating at temperatures below the temperature at which crystallization may occur. Stable solutions of metal alkoxides are prepared by reacting or dissolving a metal alkoxide in alcohol such as absolute ethanol. The solution may be spincast on essentially any substrate, conductor or nonconductor, crystalline or amorphous, transparent or opaque, and even including plastics. Hydrolysis and polycondensation occur in situ to deposit an amorphous ferroelectric film. Residual alcohol is extracted by heating below the temperature at which crystallization occurs. Such films show P-E hysteresis loops and pyroelectric current. Such ferroelectric thin films are useable in electronic, opto-electronic and optical devices.

14 Claims, 2 Drawing Sheets

METHOD FOR FORMING AMORPHOUS FERROELECTRIC MATERIALS

This invention was made with Government support under Grant No. AFOSR-88-0066 awarded by the U.S. Air Force. The Government has certain rights in this invention.

This is a continuation of application Ser. No. 07/694,140 filed on May 1, 1991 now abandoned.

BACKGROUND

This invention relates to ferroelectric materials which are amorphous instead of crystalline. In particular, it concerns a technique for preparing thin films of amorphous ferroelectric material by condensation from a liquid solution containing precursor compounds.

It has been well established that many crystalline mixed oxide compositions such as barium titanate, $BaTiO_3$, $LiNbO_3$, $Pb(Zr,Ti)O_3$, $(Sr,Ba)Nb_2O_6$, and the like, are ferroelectric in nature and both single crystal and polycrystalline forms of these materials have large numbers of practical and potential applications in electronic, opto-electronic, nonlinear optical and piezoelectric devices. Such applications include, for example, optical wave guides, electro-acoustic transducers, high frequency surface acoustic wave devices, pyroelectric infrared detectors, ferroelectric memory cells, ferroelectric photoconductor displays, optical modulators, field effect transistors, metal/insulator/semiconductor transistors and the like.

For many years, it has been believed by the scientific community that ferroelectricity can only exist in a crystalline material with long range order. In 1977, a theoretical discussion suggested that the presence of ferroelectricity in an amorphous glass was not excluded on theoretical grounds and a model for a possible amorphous ferroelectric material was proposed. "Microscopic model for a ferroelectric glass" by M. E. Lines, Physical Review B, 15 (Jan. 1, 1977).

Since then, there have been sporadic efforts to produce an amorphous ferroelectric material without apparent success. Techniques for producing amorphous materials have included RF sputtering or in at least one case by extremely rapid quench freezing of molten lithium niobate and lithium tantalate. "Anomalous dielectric behavior and reversible pyroelectricity in roller-quenched $LiNbO_3$ and $LiTaO_3$ glass", by A. M. Glass, M. E. Lines, K. Nassau and J. W. Shiever, Applied Physics Letters, 31 (Aug. 15, 1977). Tantalizing hints of ferroelectricity such as anomalies in the dielectric constant have been noted in amorphous materials. In addition, Glass, et al. noted a pyroelectric response. However, they concluded that "these observations are consistent with ferroelectric behavior, but not conclusive . . ."

To unambiguously show ferroelectricity in a material, it is generally regarded that the most significant indication of ferroelectricity is the well known P-E hysteresis loop. The polarization P as a function of the electric field E shows a characteristic hysteresis loop in an alternating field due to the field required to reverse polarization. Another important criterion is the presence of pyroelectric current, namely current flow from a poled material as temperature is changed.

Ferroelectric materials also have a ferroelectric to paraelectric phase transition temperature $T_c$ sometimes referred to as the Curie temperature. A material may be ferroelectric below the Curie temperature and it loses ferroelectricity abruptly at this temperature. One may also observe ferroelectric domains in the material and a dielectric anomaly is likely to be observed. This anomaly may take the form of three or four orders of magnitude increase in dielectric constant near the Curie temperature.

Some of these phenomena may not be observed in a given sample. More than one of these phenomena should be observed to unambiguously determine that there is ferroelectricity. Observation of a P-E hysteresis loop is regarded as proof of ferroelectricity, although it is still desireable to confirm this by observing pyroelectric current and other ferroelectric phenomenon.

Existing metal oxide-based ferroelectrics fall into two general categories, single crystals and polycrystalline ceramics. Single crystals are typically grown from melts at high temperatures by slowly cooling down certain regions of the melt and allowing the growth of a single crystal. A Czochralski technique may be used. Polycrystalline ceramics may be made through solid state reactions of powders or from a melt. Thin films of ferroelectric material may be made in the form of single crystals or in a polycrystalline form. These thin films have principally been obtained by vapor-phase deposition and sputtering, followed by heating to fully crystallize the deposited film.

It has now been discovered that stable ferroelectricity can be produced in amorphous materials formed by a modified sol-gel technique. The ferroelectric effect has not only been found in mixed metal oxides known to be ferroelectric in their crystalline state, but also in certain single metal oxides never previously known to be ferroelectric. The materials are stabilized, for example, by heating, so that stable ferroelectric properties persist during use of the films.

In recent years, the so called sol-gel technique has been used for preparing crystalline metal oxide-based ferroelectric materials in either thin film or powder form. This technique employs organometallic compounds or metal alkoxides to make a homogenous solution. The solution is typically hydrolyzed to produce a gel which may be precipitated, dried and crushed to form a powder, or the solution may be used for coating a thin film on a substrate. The powders or thin films are then heated above a crystallization temperature to produce a polycrystalline ferroelectric material.

Research has been directed to the deposition and crystallization parameters of the technique on the premise that to obtain ferroelectricity full crystallization is necessary. The morphology of the polycrystalline film has been a major concern since it in large part dictates the characteristics of the film. Since there are shortcomings due to grain boundaries in polycrystalline thin films, efforts have also been directed toward growing single crystal films by the sol-gel technique.

It is desirable to have a technique for forming a ferroelectric material which can be processed at low temperatures so that there is greater freedom in selection of materials compatible with processing of the ferroelectric material. It is desirable that the technique for producing the ferroelectric material be suitable for forming thin films for use in modern electronic and optical devices.

BRIEF SUMMARY OF THE INVENTION

Thus, in practice of this invention according to a presently preferred embodiment, an amorphous ferroelectric material is made by preparing a liquid solution containing at least one precursor compound for the ferroelectric material. Solvent is removed to leave an amorphous ferroelectric solid. This solid ferroelectric material is then stabilized at temperatures less than sufficient to crystalize the amorphous material for minimizing changes in ferroelectric properties. During solvent removal, hydrolysis and polycondensation may occur.

Amorphous ferroelectric materials include compositions which, when crystallized, have the crystal structure of known ferroelectric crystals, such as $BaTiO_3$(Sr,Ba)$Nb_2O_6$, $LiNbO_3$, $Pb(Zr,Ti)O_3$ and $(Pb,La)(Zr,Ti)O_3$. The ferroelectric materials include nonstoichiometric mixed metal oxides such as $2[Li_xNb_{(1-x)}O_y]$ where x is in the range of from 0 to 0.5 and $y=(5-4x)/2$ and $Pb(Zr_xTi_{(1-x)})O_3$ where x is in the range of from 0 to 1. The first example includes a single metal oxide $Nb_2O_5$. Other single oxides in amorphous form which show P-E hysteresis include $ZrO_2$, $SnO_2$, $TiO_2$, $Y_2O_3$, $BaO$, $SiO_2$ and $B_2O_3$, for example. The ferroelectric effect is independent of the substrate on which a thin film is deposited and the substrate may include organic polymers such as electrically conductive polymers. Electronic, optoelectronic and optical devices may employ amorphous ferroelectric films.

BRIEF DESCRIPTION OF THE DRAWINGS

These and other features and advantages of the present invention will be appreciated as the same becomes better understood by reference to the following detailed description when considered in connection with the accompanying drawings wherein.

DETAILED DESCRIPTION

Figure 1:
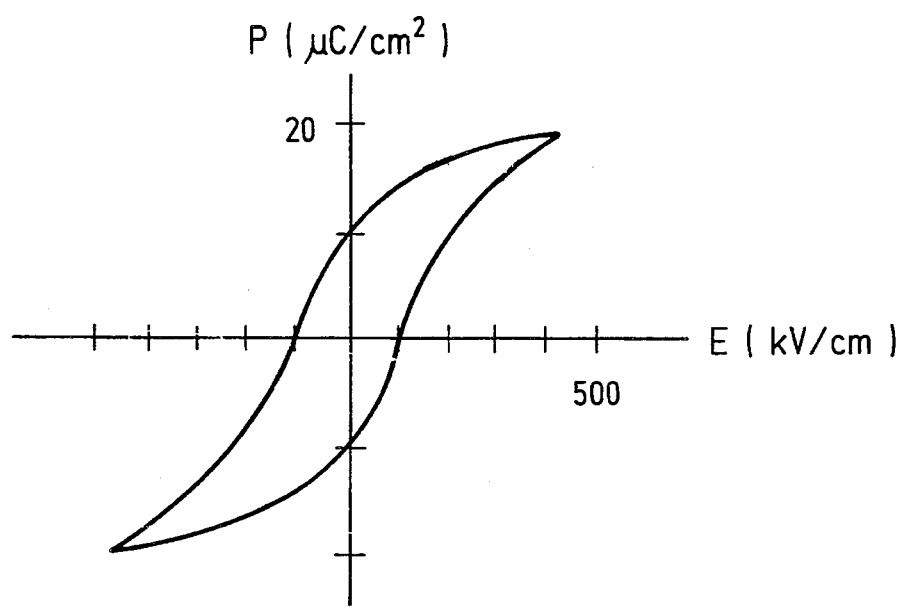
FIG. 1 illustrates an exemplary P-E hysteresis loop of an amorphous ferroelectric material.

Very generally speaking, a sol-gel process for forming an amorphous ferroelectric material starts with formation of a solution containing one or more organometallic compounds forming a precursor for the thin film. For example, for a binary metal oxide ferroelectric, the solution may contain appropriate proportions of two metal alkoxides which may react to form a double metal alkoxide, or which may remain separately in solution. In some cases, water may be added to the solution to cause formation of a gel.

Such a solution or gel may be applied to a substrate to form a thin film or the gel may be dried in bulk. The dried solid may be pulverized to form a ferroelectric powder. Alternatively, the metal alkoxide solution may be applied to a substrate to form a thin film and hydrolyzed in situ to form an amorphous ferroelectric thin film.

The amorphous ferroelectric material is stabilized, typically by heating to a relatively low temperature in a suitable atmosphere for complete hydrolysis and removal of organic materials.

An example of the formation of a ferroelectric thin film involves stoichiometric lithium niobate, $LiNbO_3$, which is known to be a ferroelectric in its crystalline state. Lithium metal is reacted with absolute ethyl alcohol, forming a solution of $LiOC_2H_5$. A typical concentration of the lithium ethoxide is in the range of from 0.2 to 0.6 Mol/l. To this solution, there is added an equal amount of $Nb(OC_2H_5)_5$ in the form of a commercially available 99.99% pure liquid. The niobium ethoxide may be simply poured into the lithium ethoxide solution since precipitation is not a problem. The solution is then boiled and refluxed for 24 hours with a water cooled reflux condenser.

Lithium and niobium ethoxides are known to form an intermolecular complex sometimes referred to as a double alkoxide upon extensive refluxing. This double alkoxide, which is soluble in ethyl alcohol, in its crystalline form closely resembles the local atomic configuration of crystalline $LiNbO_3$. In the ethyl alcohol solution, the $LiNb(OC_2H_5)_6$ double alkoxide is stable and may be detected by FTIR and NMR. Hydrolysis and polycondensation of the double alkoxide produces a lithium niobate having the composition of the alkoxide precursors.

The entire synthesis, mixing and reflux is conducted in a dry nitrogen glove box. Reflux may also be conducted outside a glove box with a thorough desiccant connected to the outlet of the condenser. It is important for maintaining shelf life to avoid introduction of water. Preferably air is excluded to exclude water vapor. A small amount of water may reduce the shelf life of the solution to a few days or even hours whereas a solution substantially free of water and isolated from the air as an essentially unlimited shelf life.

A solution prepared in this manner may then be used for coating a thin film on a selected substrate by conventional spin casting. In this technique, a substrate is secured to a spinner, typically with a vacuum chuck. The substrate is rotated at a selected speed to spread a liquid in a thin film. The thickness of the film obtained depends on a number of parameters including rotation speed (higher speed produces a thinner film), solute concentration (increased concentration of the organometallic produces an increased thickness), relative humidity (higher humidity produces a thicker film), and temperature (generally speaking, higher temperature produces a somewhat thinner film).

It is desirable when casting and hydrolyzing the thin films of amorphous ferroelectric material to have a low relative humidity. Preferably, the relative humidity in the air during casting and initial hydrolysis is in the range of from 10 to 25%. Some humidity is desirable to assure hydrolysis and polycondensation of the ferroelectric material. High relative humidity may induce such rapid hydrolysis that the homogeneity of the film is jeopardized. Very high relative humidity may also produce a thick film that is subject to cracking. A relative humidity as high as 50% may be tolerated for some films. Hydrolysis in such a high relative humidity may be largely complete in a minute or so. The hydrolysis reaction occurs rapidly, but evaporation of the resultant alcohol may be impeded.

Film thicknesses from 500 to 6000 Angstroms may be formed. If desired, a thicker film may be obtained by permitting the film to stand in air for a sufficient period to largely complete hydrolysis at least at the surface. The hydrolyzed solid is essentially insoluble in the solution. Substantially complete hydrolysis can be obtained in no more than a few minutes, then another drop of solution may be added to the substrate on the spincaster.

If one tries to produce too thick a film with this technique, there may be cracking.

If desired, one may make a thicker film in several layers with stabilization of the underlying films. With intermediate stabilization of the film by heating, cracking may be minimized.

When the metal alkoxide is contacted by water, such as the water vapor present in air, there is polycondensation of a polymer having metal-oxygen-metal bonds. The alkyl group is released as the corresponding alcohol. Typically the solvent used is the same as the alcohol released.

When water is added to the solution before forming a thin film, a prepolymer may be formed as particles in a gel. The gel may be completely hydrolyzed and solvent extracted to form a more or less solid body. Such a body may be crushed to form a ferroelectric powder. The prepolymer may be coated on a substrate by spraying, dipping, spincasting, or the like, with hydrolysis and complete polymerization occurring in situ on the substrate.

When dipping film thickness is controlled by speed of withdrawal of the substrate from the solution, temperature, solute concentration, and relative humidity. Ordinary, normal room temperature and humidity conditions fall within the desired temperature and humidity range for dip coating.

Prepolymerization by adding water to the solution may reduce the shelf life of the solution. It may also lower the crystallization temperature of the amorphous material. Thus, it is preferred to deposit films from solutions free of water, or at best, with water added only a short time before deposition.

After spincasting, the film is stabilized for minimizing future changes in ferroelectric properties. The as-cast film includes organic materials which may comprise some of the alkoxy compound which is not yet hydrolyzed, the released alcohol from the hydrolysis, and the alcohol solvent. Heating of the amorphous ferroelectric material at a temperature less than sufficient to cause crystallization can quickly stabilize the film. The heating accelerates hydrolysis and vaporization of the solvent. Heating in air at 100° C. for as little as two hours can reduce the organic content of the film from about six mol percent to one mol percent. Higher temperatures may be used for stabilization without crystallizing the film. Heating may be in air or an inert atmosphere. Water vapor may be present in the atmosphere during heating to assure complete hydrolysis.

In one example, a thin film of lithium niobate amorphous ferroelectric material had a thickness of about 1100 Angstroms. It was stabilized by heating in air for one hour at 200° C. The composition profile of the film was measured by Auger analysis. The nominal composition of the film after stabilizing was $Li_{1.01}Nb_{0.99}(OC_2H_5)_{0.0060}O_{2.75}$. Thus, the organic content of the film was about one percent. The reason for the apparent deficiency of oxygen is not clear.

It is desirable that the amorphous material be essentially completely hydrolyzed before appreciable heating. This is significant to help avoid oxidation of the organic material with the possible consequence of producing a metal carbonate which is not ferroelectric. Generally speaking, oxidation is undesirable since it tends to reduce the remanent polarization of the ferroelectric material. If desired, oxidation may be largely eliminated by casting and hydrolyzing a thin film of amorphous ferroelectric material in a moist nitrogen environment.

The ferroelectric properties of a film are apparently unaffected by the substrate on which the film is deposited. Indicative of that is confirmation of ferroelectric properties of films deposited on amorphous silicon carbide, semiconductors such as silicon (n-type, p-type or intrinsic) and gallium arsenide, insulators such as fused quartz, Pyrex borosilicate glass, aluminum oxide, and magnesium oxide, metals such as gold, platinum, aluminum, and iron, conductors such as indium tin oxide, polypyrrole, and polyaniline, and ferroelectric materials such as lithium tantalate and single crystal lithium niobate. This shows the versatility of amorphous ferroelectric materials for a broad variety of applications.

The ferroelectric material is stabilized by heating in air to a sufficient temperature to complete the hydrolysis and drive off remaining organic material. The temperature required depends on the thickness of the film, relative humidity, the solvent employed, reaction products from the precursors, temperature resistance of the substrate and the crystallization temperature of the amorphous ferroelectric material.

The as deposited film contains alkoxy and hydroxy groups, for example. These continue to undergo reaction and evaporation after deposition. Although the as deposited films show ferroelectric behavior, the characteristics are not stabilized until these groups are removed or otherwise stabilized.

For example, thin film lithium niobate crystallization commences in the range of from 350° to 450° C. depending on conditions. Stabilization of the amorphous material is therefore desirably conducted at a temperature of up to about 250° C. to assure that there is no crystallization. The time of heating depends on temperature, with higher temperatures requiring shorter heating cycles. Preferably, the heating rate is in the range of from about 1° to 5° C. per minute. A relatively low heating rate is desirable to avoid cracking, with slower rates being preferred for thicker films. Time is required for solvent to diffuse from the film and for structural relaxation to occur. It is noted that during stabilization, shrinkage of as much as 50% of film thickness may occur.

Stabilization may also be obtained by assuring that there is ample exposure to water vapor at room temperature, and the film may be further consolidated by enhancing the evaporation of solvent in a vacuum system.

Heating in air to a temperature in excess of the expected service temperature of the product employing the ferroelectric material remains the preferred technique for stabilizing the film. Stabilizing a film at somewhat elevated temperatures is desireable for producing a relatively dense film. A denser film provides a higher remanent polarization $P_r$. In the tests to date, values of $P_r$ of from 6 to 18 have been observed, which is within the range of ferroelectric thin films currently in use.

The low temperatures needed for stabilizing are particularly attractive for formation of a ferroelectric thin film on a plastic substrate. For example, it has been shown that an amorphous ferroelectric thin film can be formed on electrically conductive polymers such as polypyrrole and polyaniline. This provides the ability to form a somewhat flexible ferroelectric device.

Ferroelectricity may be caused by several entirely different mechanisms. A common feature for all known ferroelectric materials is the existence of electric dipoles prior to the application of an external electric field, wherein the dipole direction can be effectively reversed by application of an electric field. Probably the most commonly mentioned example is a barium titanate crystal, BaTiO$_3$, consisting of oxygen octahedra with a Ti$^{4+}$ cation enclosed near the center of the oxygen octahedron. Because of the size of the ions, there is enough room in such an octahedron for the Ti$^{4+}$ ion to "rattle" between corners of the octahedron. At room temperature, this "rattling cage" remains stationary with the cation off-center near one of the corners of the octahedron. This asymmetry creates an electric dipole.

Under the influence of an external electric field, the relative positions of the Ti$^{4+}$ and O$^{2-}$ ions can be changed so that the center of their corresponding charges shift from the equilibrium positions in the octahedron in opposite directions along the electric field. When the electric field direction reverses, the original dipole direction can in turn be reversed by overcoming a potential barrier. In the case of barium titanate, it is commonly recognized that the potential barrier is caused by the combination of spontaneous polarization of the dipoles on a macroscopic scale (usually referred to as the formation of domains) and an inherent potential barrier at a microscopic scale. It is the reversibility of the dipoles and the existence of the potential barrier that results in the well-known P-E hysteresis behavior which is characteristic of ferroelectric materials.

In practice of this invention, the importance of the octahedron structure is recognized. When making an amorphous ferroelectric material, one seeks to recreate the nearest neighbor structure of the corresponding crystalline ferroelectric material and at the same time maintain a long range disorder. With this in mind, one may, through polycondensation of an organometallic compound, produce amorphous ferroelectric films of virtually every known metal oxide-based ferroelectric material.

However, it appears that close resemblance of the local structure to corresponding crystalline ferroelectric materials does not appear to be necessary. A necessary and sufficient condition for ferroelectricity is the existence of a reversible electric dipole and potential barrier that resists the reversal or annihilation of the dipole. Thus, there are a number of amorphous metal oxide systems in both mixed oxides and amorphous single metal oxides which are ferroelectric where it is not certain that an octahedral local structure is present.

Amorphous ferroelectricity has been observed in a broad variety of materials. This has been shown by the P-E hysteresis curves. FIG. 1 illustrates an exemplary P-E hysteresis curve at 50 Hz for a lithium niobate sample deposited on a gold coating on a silicon wafer. The film was stabilized at 250° C. for one hour. This is neither the best nor worst hysteresis curve observed, but is merely exemplary.

A modified Sawyer-Tower bridge was used for the P-E hysteresis measurements. Most hysteresis curves were observed at 50 Hz. Some observations were made at frequencies as high as 12 kHz for verifying that the hysteresis loops seen were not due to space charge or other possible low frequency effects in the dielectric material.

In a typical hysteresis test set up, the substrate is electrically conductive. A metal "spot" of known area is sputtered on the surface of the thin film. Electrical contact is made to the metal spot and the conductive substrate for connection in the bridge.

In order to exclude any possible interface effects between a gel film and the substrate, a ground powder of bulk gel was used to independently confirm the hysteresis loops. For example, a lithium-niobium ethoxide solution was hydrolyzed and dried. The resultant solid amorphous lithium niobate was pulverized to form a powder and was stabilized at 100° C. for two hours in air. The gel powder was dispersed in acetone and dropped on the polished surface of a copper plate. A second copper plate was then pressed onto the other side of the powder layer to form a sandwich with the copper plates forming the electrical contacts for the bridge. The same type of hysteresis loops were obtained for the powder as for a thin film of similar material.

Another independent verification of amorphous ferroelectricity estimated the characteristic Maxwell relaxation time of a thin film deposited on fused quartz and stabilized at 100° C. A relaxation time in the order of $10^4$ seconds was estimated, corresponding to $10^{-4}$ Hz, too slow to contribute to the hysteresis loop measurements which were at 50 Hz and higher. The electrical conductivity was measured at about $10^{-6}/\Omega$-cm.

Figure 2:
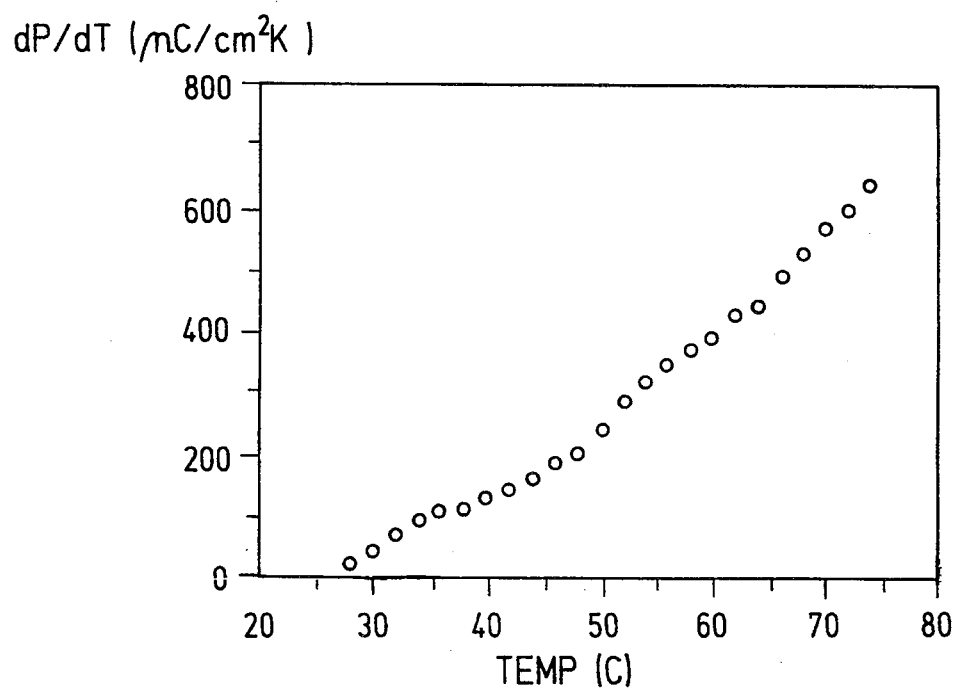
FIG. 2 illustrates pyroelectric current of an amorphous ferroelectric film.

Another verification of ferroelectricity is illustrated in FIG. 2. A sample of amorphous ferroelectric lithium niobate was poled by cooling from 75° C. in a d.c. electric field. After space charges were eliminated, pyroelectric coefficient was measured during reheating several hours after poling. FIG. 2 illustrates dP/dT as a function of temperature where P is the peak saturation polarization and the units of the pyroelectric coefficient are nanocoulombs per cm$^2$K.

That the ferroelectric material was amorphous was confirmed by X-ray diffraction and electron diffraction. An electron diffraction pattern shows only diffuse rings. The observable limit of crystallite size in the X-ray diffraction is approximately 100 angstroms, while that of electron diffraction was 20 Angstroms. No crystallites were observed. Both of these tests indicate the basically amorphous nature of the film. If there were any small crystallites, they were necessarily smaller than 20 angstroms.

Another significant amorphous ferroelectric material comprises barium titanate. The solution for depositing a film of barium titanate is made by first dissolving titanium isopropoxide in isopropyl alcohol. Next, one gradually adds barium n-butoxide gradually while stirring vigorously so that no precipitation occurs. The proportions of barium and titanium in the solution are equal so that a stoichiometric double alkoxide is formed and the solution and barium titanate is condensed. The total concentration is in the range of from 0.2 to 0.6 Mol/l. The solution is refluxed for several hours. It is important to form this solution in the absence of moisture since the composition hydrolyzes quite readily. A double alkoxide forms rapidly with only an hour of reflux. A thin film deposited from the solution forms a ferroelectric amorphous film of barium titanate.

A particularly useful amorphous ferroelectric material is known as PZT, which has the formula Pb(Zr$_x$Ti$_{(1-x)}$)O$_3$, where x is in the range of from 0 to 1. A specific example shown to be ferroelectric comprises Pb(Zr$_{0.52}$Ti$_{0.48}$)O$_3$. Precursors for PZT include titanium isopropoxide and zirconium n-propoxide. The zirconium and titanium alkoxide compounds are mixed in isopropanol. Separately, one dissolves lead acetate in isopropanol. The lead isopropanol solution is very gradually added to the zirconium-titanium solution with vigorous stirring. The solution is refluxed for one to eight hours. The solution does not form a double alkoxide like the lithium-niobium system, but is a true solution of the three precursor compounds. Refluxing is to assure homogeneity rather than to promote reaction.

Another useful amorphous ferroelectric material, sometimes referred to in its crystalline form as SBN is strontium barium niobate having the formula $(Sr_xBa_{(1-x)})Nb_2O_6$ where x is in the range of from 0.25 to 0.75. An exemplary composition shown to be ferroelectric comprises $(Sr_{0.6}Ba_{0.4})Nb_2O_6$. The solution for depositing SBN is made by reacting strontium metal with absolute ethanol to form a first solution of strontium ethoxide. A separate solution of barium ethoxide is formed by reacting barium metal with absolute ethanol. Appropriate proportions of the solutions are then mixed together. An appropriate amount of liquid niobium ethoxide is slowly dropped into the mixed solution with vigorous stirring. The resultant solution is refluxed for about five hours. Typical concentration of the solutes in the solvent is in the range of from 0.2 to 0.6 Mol/l. The SBN precursor composition is extremely sensitive to moisture and the reactions are conducted and the product stored in a dry nitrogen environment. A thin film of amorphous SBN may then be formed by spincasting or by spraying or dipping.

Other amorphous oxide-based ferroelectric materials may be made by a similar technique of forming or dissolving metal alkoxides or other organometallic compounds in an organic solvent, and hydrolyzing the solute in the resulting solution either in bulk, or during or after deposition as a thin film.

Another useful amorphous ferroelectric material comprises PLZT, a mixed metal oxide of lead, lanthanum, zirconium and titanium. Other ferroelectric materials include $Pb_{0.92}Bi_{0.07}La_{0.01}(Fe_{0.405}Nb_{0.325}Zr_{0.27})O_3$, $LiTaO_3$, $Bi_4Ti_3O_{12}$, potassium niobate, lead zirconate-lead titanate nonstoichiometric solid solutions, lead titanate, lead niobate, lead tantalate, lead bismuth niobate, lithium tantalate, sodium vanadate, silver vanadate, barium lithium oxyfluoaluminate, $Ba(Al_{1.4}Li_{0.6})(O_{2.8}F_{1.2})$, and lead iron niobate, $Pb_2(Fe,Nb)O_6$. Other ferroelectric materials may be produced which have Curie temperatures substantially below room temperature such as potassium tantalate, sodium niobate, cadmium titanate, strontium (pyro)tantalate, tungsten trioxide and the like.

It should be noted from the disclosures above that an amorphous ferroelectric material of mixed metal oxides may be produced with a nonstoichiometric composition. Thus, amorphous ferroelectric materials include $2[Li_xNb_{(1-x)}O_y]$ where x is in the range of from 0 to 0.5 and y is $(5-4x)/2$, $Pb(Zr_xTi_{(1-x)})O_3$ where x is in the range of from at least 0 to 1 and $(Sr_xBa_{(1-x)})Nb_2O_6$ where x is in the range of from 0.25 to 0.75.

The following table shows the compositions and properties of stoichiometric lithium niobate, nonstoichiometric LN compositions and niobium oxide which surprisingly in the amorphous form is ferroelectric.

substrate) for P-E hysteresis measurements. The samples were stabilized at 100° C. for two hours in air. The magnitude of the remanent polarization $P_r$ is in the order of 20% of the polarization of single crystal $LiNbO_3$.

The pyroelectric current was measured for the two samples indicated with films deposited on n-type silicon (111) single crystal wafers. The amorphous films were spin-coated on the polished surface of the silicon wafer and stabilized at 100° C. for five hours in air. Gold was sputtered onto the surface of the film to form the top electrode with the silicon used as the other electrode.

The sample was then preheated to 75° C. and a DC voltage of five volts was applied across the electrode and maintained as the sample was slowly cooled down to room temperature. The five volt bias was removed at room temperature and the electrodes electrically connected through a picoammeter for measuring current while the sample was reheated at a constant heating rate up to 75° C. This allowed measurement of the depolarization current as a function of temperature. After again cooling to room temperature, a third cycle of heating to 75° C. was conducted and the pyroelectric current was monitored.

The junction current which is a function of temperature was measured first. After poling the film by cooling with an applied DC voltage, the current was measured during the second heating. This current is a sum of the junction current, a depolarization current and the pyroelectric current. The pyroelectric current is measured on the third heating and from that the pyroelectric coefficient as a function of temperature can be calculated.

A particularly surprising discovery is that an amorphous film of niobium oxide, $Nb_2O_5$, deposited from solution is ferroelectric. Further investigation has established that amorphous zirconium oxide, tin oxide, titanium oxide, yttrium oxide, barium oxide, silicon oxide and boron oxide are also ferroelectric and may be stabilized as amorphous ferroelectric materials (e.g. by heating at 260° C. for one hour in air). Such materials are not known to be ferroelectric in their crystalline form. This is probably due to the symmetry in their crystalline form which prevents a dipole moment. On the other hand, the amorphous material has distortion that breaks down the symmetry and may be ferroelectric.

It is believed that other single metal oxides in amorphous form as described herein are also ferroelectric including, for example, oxides of vanadium, hafnium, tungsten, lanthanum and the lanthanide metals.

As an example of an amorphous ferroelectric single metal oxide, one can refer again to niobium oxide, $Nb_2O_5$. A solution for producing amorphous niobium oxide has niobium ethoxide dissolved in absolute ethanol. A thin film of niobium oxide was deposited on n-type silicon (111) and the properties measured. A film

TABLE 1

| Composition | $LiNbO_3$ | $Li_{0.33}Nb_{1.67}O_{4.34}$ | $Li_{.25}Nb_{1.75}O_{4.5}$ | $Nb_2O_5$ |
|---|---|---|---|---|
| Film Thickness (Å) | 2100 | 2300 | 2560 | 2870 |
| $P_r$ (C/cm$^2$) | 10 | 14 | 9 | 18 |
| $E_c$ (kV/cm) | 110 | 86 | 65 | 24 |
| Refractive Index | 1.43 | 1.13 | 1.13 | 1.15 |
| Pyroelectric Coefficient @ 28° C. (nC/cm$^2$ K) | 24 | — | — | 8 |
| Dielectric Constant | 5 | — | — | — |

All of the samples listed in the table were deposited as a thin film on a gold substrate (a film of gold on a silicon having a thickness of 1600 angstroms was spincast and retained at room temperature in air for five hours for hydrolysis and polycondensation. The remanent polarization $P_r$ was 9.7 $\mu C/cm^2$ and coercive field $E_c$ was measured at 3.7 kV/mm. The pyroelectric coefficient was 8.1 $nC/cm^2K$. X-ray diffraction showed that the film was amorphous.

Another film of the same material was heated for five hours at 350° C. in air. The film thickness was 1250 angstroms, $P_r$ was 12.2 and $E_c$ was 5.4. X-ray diffraction showed that this film was also amorphous.

A similar film was heated for five hours at 450° C. in air. The film thickness was 1250 angstroms. $P_r$ was 7.95 and $E_c$ was 6.0. The pyroelectric coefficient was 88. X-ray diffraction showed peaks coincident with those of gamma-phase $Nb_2O_5$.

Thus, it was shown that gamma niobium oxide has P-E hysteresis behavior indicating its ferroelectricity. P-E hysteresis was also measured using the copper/oxide powder/copper sandwich mentioned above for alpha-phase niobium oxide, gamma-phase niobium oxide, and rutile, $TiO_2$.

Thus, ferroelectric behavior has been observed for certain crystalline single metal oxides not previously identified as ferroelectric.

Figure 3:
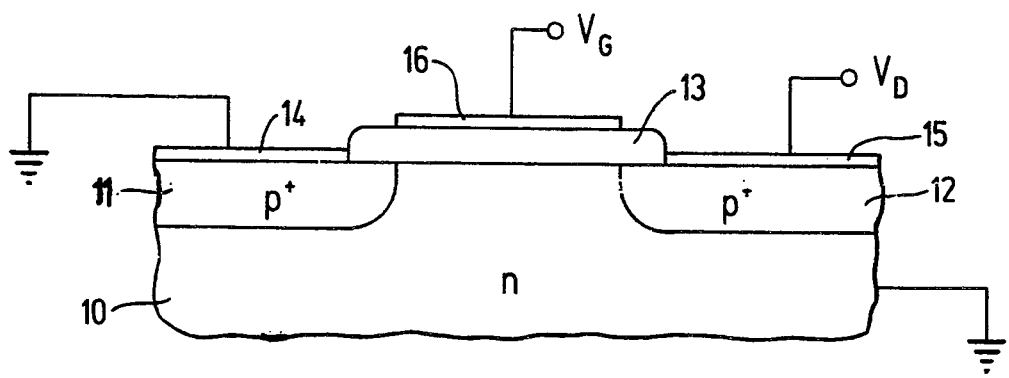
FIG. 3 illustrates an exemplary electronic device employing an amorphous ferroelectric film.

Amorphous ferroelectric thin films are useful in a broad variety of electronic, opto-electronic and optical devices where polycrystalline ferroelectric materials may also find utility. Thus, for example, FIG. 3 illustrates an exemplary field effect transistor employing an amorphous ferroelectric thin film. Such a transistor is formed on an n-type silicon substrate 10. P-type dopants are diffused into the substrate to form a source 11 and drain 12. A thin film of amorphous ferroelectric material 13 such as lithium niobate is deposited on the silicon surface between the source and drain. Metal films are deposited to form a source electrode 14 and drain electrode 15 connected to the source and drain, respectively. A metal film gate electrode 16 is deposited on a portion of the gate 13 for control of the transistor. Such a metal\ferroelectric\semiconductor transistor may be a discrete component or a component in an integrated circuit.

Figure 4:
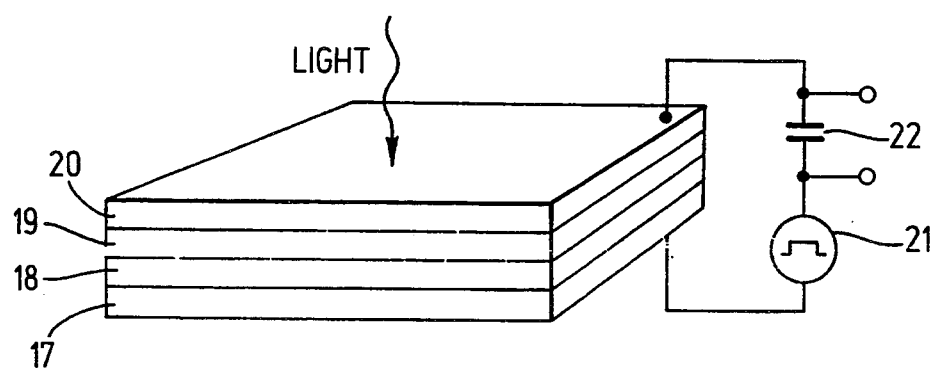
FIG. 4 illustrates an exemplary optoelectronic device employing a ferroelectric film.

FIG. 4 illustrates schematically an opto-electronic, ferroelectric-photoconductor memory device. Such a memory device has a substrate electrode 17 on which is deposited a ferroelectric thin film 18 such as lithium niobate. The amorphous ferroelectric film is surmounted by a conventional deposited photoconductor film 19 and transparent electrode 20. The two electrodes are connected to a drive voltage source 21. A data signal may be read out across a capacitor 22 connected across the electrodes of the memory device. Data are written into or read out of the ferroelectric layer from the memory chip when both voltage pulses are applied and light is pulsed onto the photoconductor film through the transparent electrode. Such an opto-electric device may be incorporated in an integrated circuit with a variety of other opto-electronic and electronic components.

In any of the electronic or opto-electronic devices, it may be highly advantageous to pole the ferroelectric material by applying an electric field and cooling the material from a temperature above the expected surface temperature of the device as described above.

Figure 5:
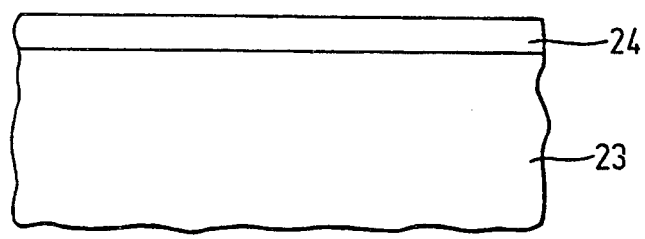
FIG. 5 illustrates an exemplary optical device employing an amorphous ferroelectric thin film.

FIG. 5 illustrates a fragment of an exemplary optical device employing an amorphous ferroelectric material. In a simple example, such an optical device comprises a ferroelectric crystal 23 such as barium titanate. An amorphous ferroelectric thin film 24 of barium titanate is deposited on a surface of the ferroelectric crystal. Since the film is amorphous, it has a slightly different index of refraction from the crystal even when chemically similar so that it can serve as a ferroelectric window. It may be particularly advantageous in such an optical device to employ a nonstoichiometric amorphous thin film for obtaining a desired index of refraction.

Various of the amorphous ferroelectric materials may be doped with small amounts of other elements for tailoring the ferroelectric, dielectric and optical properties for a selected application. It should also be recognized that the ferroelectric properties such as P-E hysteresis and dielectric properties of the thin film may be selected by varying the nonstoichiometric composition or by depositing multiple layers of amorphous ferroelectric materials of different composition.

Although a considerable variety of amorphous mixed metal oxides and single metal oxides have been shown to be ferroelectric, it will be understood that additional similar oxides of stoichiometric and nonstoichiometric compositions may have equivalent ferroelectricity. Examples have been given of techniques for forming amorphous ferroelectric materials by a modified sol-gel process. Many additional modifications of the process for producing amorphous ferroelectric materials will be apparent to those familiar with such processes. It is therefore to be understood that within the scope of the appended claims, this invention may be practiced otherwise than as specifically described herein.

What is claimed is:

1. A method for forming an amorphous material having reversible spontaneous electric polarization, the method comprising the steps of:

preparing an anhydrous solution containing at least one precursor compound for the material;

maintaining the anhydrous solution free of water until the solution is exposed to a substrate;

exposing the solution to a substrate in the presence of water vapor and thereby simultaneously depositing a film on the substrate, hydrolyzing the precursor compound, polycondensing the hydrolyzed precursor compound and removing solvent from the anhydrous solution to thereby form condensed amorphous solid material; and heating the condensed amorphous material at a sufficient temperature for stabilizing its amorphous structure and an insufficient temperature for crystallization.

2. A method as recited in claim 1 wherein the precursor compound comprises an organometallic compound.

3. A method as recited in claim 1 wherein the precursor compound comprises a metal alkoxide.

4. A method as recited in claim 1 comprising the step of applying an electric field to the condensed amorphous material for poling the material.

5. A method for forming an amorphous ferroelectric material comprising the steps of:

forming an anhydrous liquid solution comprising an organic solvent and at least one metal alkoxide;

maintaining the anhydrous solution free of water until the solution is exposed to a substrate;

simultaneously exposing the solution to a substrate in the presence of water vapor and thereby simultaneously depositing a film on the substrate, hydrolyzing the alkoxide, polycondensing the hydrolyzed alkoxide and removing solvent from the anhydrous solution to thereby form a solid film; and stabilizing the solid film at a temperature less than sufficient to crystallize the solid film.

6. A method as recited in claim 5 comprising forming the solution comprising a plurality of metal alkoxides.

7. A method as recited in claim 5 wherein the metal alkoxide is a mixed metal alkoxide and wherein the solution contains at least one mixed metal alkoxide selected from the group consisting of $Li_xNb_{(1-x)}O_y$ where x is in the range of from 0 to 0.5 and $y=(5-4x)/2$, $Pb(Zr_xTi_{(1-x)})O_3$ where x is in the range of from 0 to 1, and $(Sr_xBa_{(1-x)})Nb_2O_6$ where x is in the range of from 0.25 to 0.75.

8. A method as recited in claim 5 wherein the depositing step comprises depositing the solution on an electrically conductive organic polymer substrate.

9. A method for forming an amorphous ferroelectric material comprising the steps of:
   forming a liquid solution comprising an organic solvent and at least one metal alkoxide which is not hydrolyzed;
   maintaining the alkoxide in the anhydrous solution free of substantial hydrolysis until the solution is exposed to a substrate;
   simultaneously exposing the solution to a substrate in the presence of water vapor and thereby simultaneously depositing a film on the substrate, hydrolyzing the alkoxide, polycondensing the hydrolyzed alkoxide and removing solvent from the anhydrous solution to thereby form a solid film; and
   stabilizing the solid film at a temperature less than sufficient to crystallize the solid film.

10. A method as recited in claim 9 comprising forming the solution comprising a plurality of metal alkoxides.

11. A method as recited in claim 9 wherein the metal alkoxide is a mixed metal alkoxide and wherein the solution contains at least one mixed metal alkoxide selected from the group consisting of $Li_xNb_{(1-x)}O_y$ where x is in the range of from 0 to 0.5 and $y=(5-4x)/2$, $Pb(Zr_xTi_{(1-x)})O_3$ where x is in the range of from 0 to 1, and $(Sr_xBa_{(1-x)})Nb_2O_6$ where x is in the range of from 0.25 to 0.75.

12. A method for forming an amorphous ferroelectric material, the method comprising the following steps:
   preparing an anhydrous solution containing at least one precursor compound for the material;
   maintaining the solution such that the precursor compound is free of hydrolysis prior to exposing a substrate to the solution;
   applying a film of the solution to a substrate such that simultaneously, the precursor compound is hydrolyzed, the hydrolyzed precursor compound is polycondensed and solvent is removed from the solution; and
   stabilizing the resulting material by heating.

13. A method for forming an amorphous material having reversible spontaneous electric polarization, the method comprising the steps of:
   preparing an anhydrous solution containing at least one precursor compound for the material;
   maintaining the anhydrous solution free of water until the solution is exposed to a substrate;
   exposing the solution to a substrate in the presence of water vapor and thereby simultaneously depositing a film on the substrate, hydrolyzing the precursor compound, polycondensing the hydrolyzed precursor compound and removing solvent from the anhydrous solution to thereby form condensed amorphous solid material; and
   stabilizing the resulting material by heating.

14. The method of claim 13 further including the step of heating the condensed amorphous material at a sufficient temperature for stabilizing its polarization properties and an insufficient temperature for crystallizing the amorphous material.

* * * * *